United States Patent [19]
Drost et al.

[11] Patent Number: 5,850,163
[45] Date of Patent: Dec. 15, 1998

[54] ACTIVE INDUCTOR OSCILLATOR WITH WIDE FREQUENCY RANGE

[75] Inventors: Robert J. Drost, Palo Alto; Robert J. Bosnyak, San Jose, both of Calif.

[73] Assignee: Sun Microsystems, Inc., Palo Alto, Calif.

[21] Appl. No.: 828,245

[22] Filed: Mar. 31, 1997

[51] Int. Cl.$^6$ .............................. H03B 5/00; H03L 7/099
[52] U.S. Cl. .................. 331/115; 331/36 R; 331/108 R; 331/117 FE; 331/177 R; 331/181
[58] Field of Search .............................. 331/36 R, 108 B, 331/108 C, 108 R, 115, 117 R, 117 FE, 132, 167, 177 R, 18

[56] References Cited

U.S. PATENT DOCUMENTS

| | | | |
|---|---|---|---|
| 4,507,622 | 3/1985 | Muth | 331/115 |
| 4,812,785 | 3/1989 | Pauker | 331/117 FE |
| 5,126,697 | 6/1992 | Nauta et al. | 331/177 R |
| 5,175,513 | 12/1992 | Hara | 331/115 |
| 5,191,302 | 3/1993 | Rossnick | 331/109 |
| 5,347,238 | 9/1994 | Kobayashi | 331/117 |
| 5,373,264 | 12/1994 | Higgins, Jr. | 331/117 |
| 5,483,207 | 1/1996 | Gabara | 331/117 |
| 5,510,755 | 4/1996 | Kodrnja et al. | 331/177 R |
| 5,561,398 | 10/1996 | Rasmussen | 331/36 C |
| 5,712,601 | 1/1998 | Shimada et al. | 331/177 R |

OTHER PUBLICATIONS

Leeson, D.B., "A Simple Model of Feedback Oscillator Noise Spectrum", Proc. of IEEE (Feb. 1966) pp. 329–330.
Abidi, Asad A., "Noise in Relaxation Oscillators", IEEE Journal of Solid–State Circuits, vol. SC–18 (Dec. 1983) pp. 794–802.
Banu, Mihai, "MOS Oscillators with Multi–Decade Tuning Range and Gigahertz Maximum Speed", IEEE Journal of Solid–State Circuits, vol. SC–23 (Apr. 1988) pp. 474–479.

*Primary Examiner*—David Mis
*Attorney, Agent, or Firm*—Skjerven, Morrill, MacPherson, Franklin & Friel, LLP; David M. Sigmond

[57] ABSTRACT

An active inductor oscillator includes a tank circuit for generating a first differential signal, a common-mode inverting differential buffer for generating a second differential signal in response to the first differential signal, and an integrating circuit for generating a third differential signal in response to the second differential signal. The third differential signal is applied to the tank circuit, and lags the first differential signal. A differential transistor pair in the tank circuit provides active inductance in response to the third differential signal, and a cross-coupled transistor pair in the tank circuit provides negative resistance that amplifies the first differential signal in response to the first differential signal. Currents through the tank circuit, buffer, and integrating circuit are essentially identical to one another and move in unison with an externally applied reference current that controls the oscillation frequency. As a result, the oscillator can achieve a wide range of oscillation frequencies. The buffer adds 180 degrees of phase shift to the common-mode loop, thereby providing negative common-mode feedback that prevents lock-up. The tank circuit, buffer and integrating circuit use differential transistor pairs that reduce phase jitter due to external common-mode noise sources.

50 Claims, 6 Drawing Sheets

ACTIVE INDUCTOR OSCILLATOR WITH WIDE FREQUENCY RANGE

BACKGROUND OF THE INVENTION

1. Field of the Invention

The present invention relates to oscillators, and more particularly to active inductor oscillators.

2. Description of Related Art

Microwave frequency oscillators are widely used in receivers, transmitters, data transmission lines, cellular phone systems, optical/analog phase-locked loop communication systems, and so on. Conventional oscillators typically use a parallel resonant circuit. Likewise, voltage controlled oscillators are known which use a series inductance in the feedback loop of a transistor and a fixed capacitance in series with the transistor to generate an oscillating frequency.

CMOS circuits are becoming increasingly popular due to their small size and low power consumption. Manufacturing a spiral inductor on a monolithic chip during CMOS fabrication requires careful modeling, complicated process steps, and a large surface area. As a result, CMOS oscillators have been developed with "active inductors" implemented by MOS transistors without passive inductors.

CMOS oscillators are often subjected to fabrication process variations in channel lengths, doping concentrations, etc., as well as operating condition variations in power supply voltage, temperature, etc. These variations force the oscillating frequency to change. Unfortunately, CMOS oscillators tend to exhibit a very narrow frequency range, for instance a 2× to 3× range, before complications arise. Such oscillators are highly susceptible to process and operating variations.

Furthermore, CMOS oscillators are often used in high-performance communication systems where high spectral purity and low phase jitter are essential. Spectral purity refers to how effectively an oscillator keeps itself at one frequency. Phase jitter refers to fluctuations in the waveform's period. CMOS oscillators such as ring oscillators and multivibrator oscillators usually have high noise susceptibility that leads to large random fluctuations in frequency and phase jitter, whereas CMOS oscillators with differential stages can have high susceptibility to common-mode lock-up.

Accordingly, a need exists for a robust CMOS oscillator with an active inductor, a wide frequency range, and high noise immunity.

SUMMARY OF THE INVENTION

A CMOS oscillator is disclosed herein which fulfills the need in the art described above.

In accordance with one aspect of the invention, an active inductor oscillator includes a tank circuit for generating a first differential signal, a common-mode inverting differential buffer for generating a second differential signal in response to the first differential signal, and an integrating circuit for generating a third differential signal in response to the second differential signal. The third differential signal is applied to the tank circuit, and lags the first and second differential signals. A differential transistor pair in the tank circuit provides active inductance in response to the third differential signal, and a cross-coupled transistor pair in the tank circuit provides negative resistance that amplifies the first differential signal in response to the first differential signal.

Advantageously, the currents through the tank circuit, buffer, and integrating circuit are essentially identical to one another and move in unison with an externally applied reference current that controls the oscillation frequency. As a result, the oscillator can achieve a wide range of oscillation frequencies. The buffer adds 180 degrees of phase shift to the common-mode loop, thereby providing negative common-mode feedback that prevents lock-up. The tank circuit, buffer and integrating circuit use differential transistor pairs that reduce phase jitter due to external common-mode noise sources.

These and other objects, features and advantages of the invention will be further described and more readily apparent from a review of the detailed description of the preferred embodiments which follow.

DETAILED DESCRIPTION OF THE PREFERRED EMBODIMENTS

Figure 1:
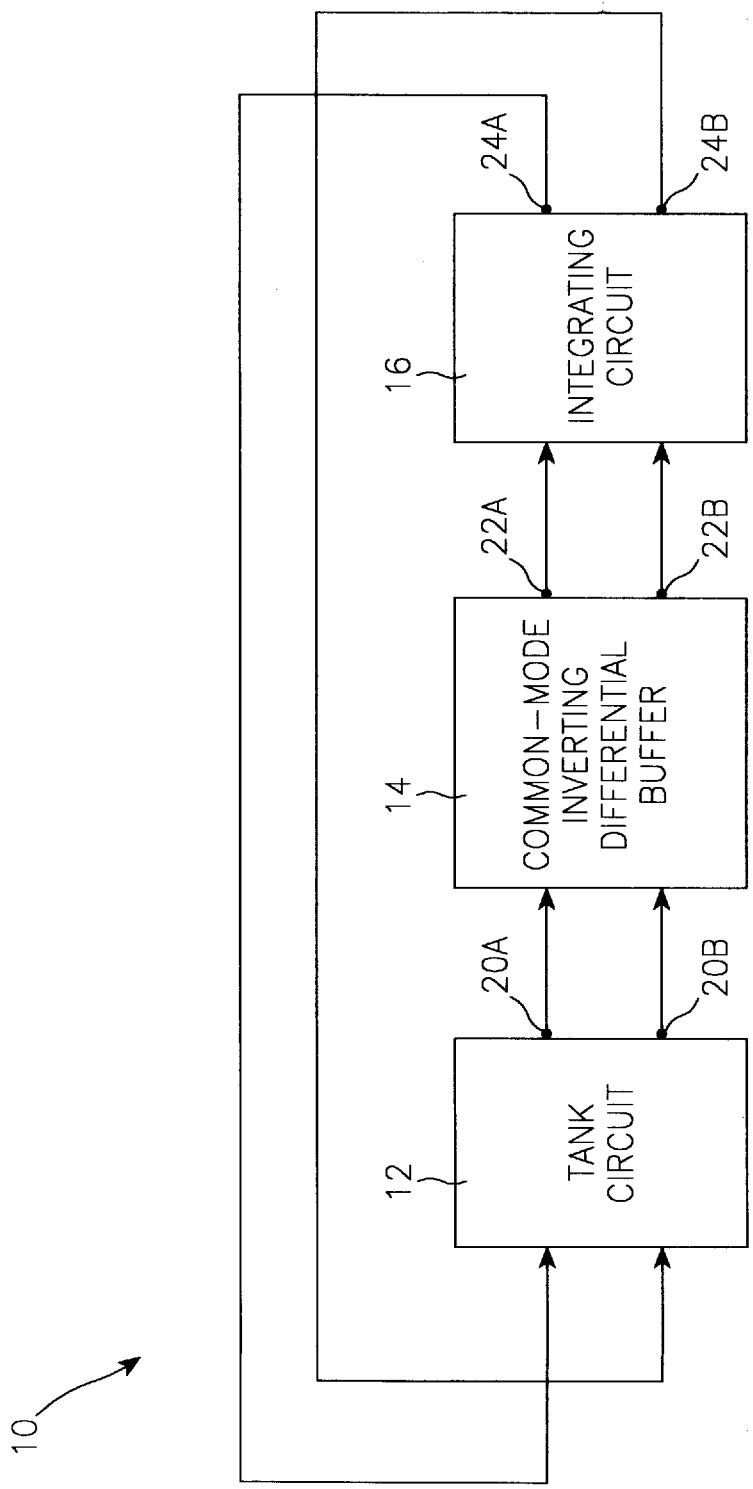
FIG. 1 illustrates a block diagram of an active inductor oscillator in accordance with an embodiment of present invention.

FIG. 1 illustrates a block diagram for an active inductor oscillator 10 in accordance with an embodiment of the present invention. Generally speaking, oscillator 10 includes tank circuit 12, common-mode inverting differential buffer 14, and integrating circuit 16. Tank circuit 12 includes parallel resonant LC circuits that determine the oscillation frequency. The parallel resonant circuits include active inductors. Buffer 14 is a high bandwidth, low gain stage that inverts the common-mode signal without inverting the differential-mode signal. Integrating circuit 16 is a low bandwidth, high gain stage that outputs the integral of the incoming signal.

Oscillator 10 is a current-controlled oscillator. The oscillation frequency varies as a function of an externally applied reference current that controls the inductance of the active inductors. Tank circuit 12, buffer 14 and integrating circuit 16 are coupled to one another voltage-wise, but are decoupled from one another current-wise.

A first sinusoidal differential voltage signal generated by tank circuit 12 at nodes 20A and 20B is applied to buffer 14, a second sinusoidal differential voltage signal generated by buffer 14 at nodes 22A and 22B is applied to integrating circuit 16, and a third sinusoidal differential voltage signal generated by integrating circuit 16 at nodes 24A and 24B and is applied to tank circuit 12.

The first differential signal has a frequency determined by the parallel resonant circuits in tank circuit 12.

The second differential signal prevents common-mode lock-up. That is, in the absence of buffer 14, integrating circuit 16 would provide positive common-mode feedback to tank circuit 12, which could easily lead to lock-up when the common-mode voltage approaches a rail (VDD or ground). Buffer 14 prevents lock-up by providing common-mode inversion so that integrating circuit 16 provides negative common-mode feedback to tank circuit 12. Furthermore, buffer 14 has little or no effect on the differential waveform, so that the second differential signal has essentially the same amplitude and phase as the first differential signal.

The third differential signal operates the active inductors in tank circuit 12. The third differential signal represents an integral of the second (and therefore the first) differential signal. Since the first and second differential signals are sinusoidal signals, the third differential signal is also a sinusoidal signal that lags the first and second differential signals by 90 degrees. When a sinusoidal signal is applied to an inductor, the inductor current lags the inductor voltage by 90 degrees. Tank circuit 12 includes voltage-to-current converters, responsive to the third differential signal, for providing currents that lag the first differential signal by 90 degrees, thereby providing inductors.

Figure 2:
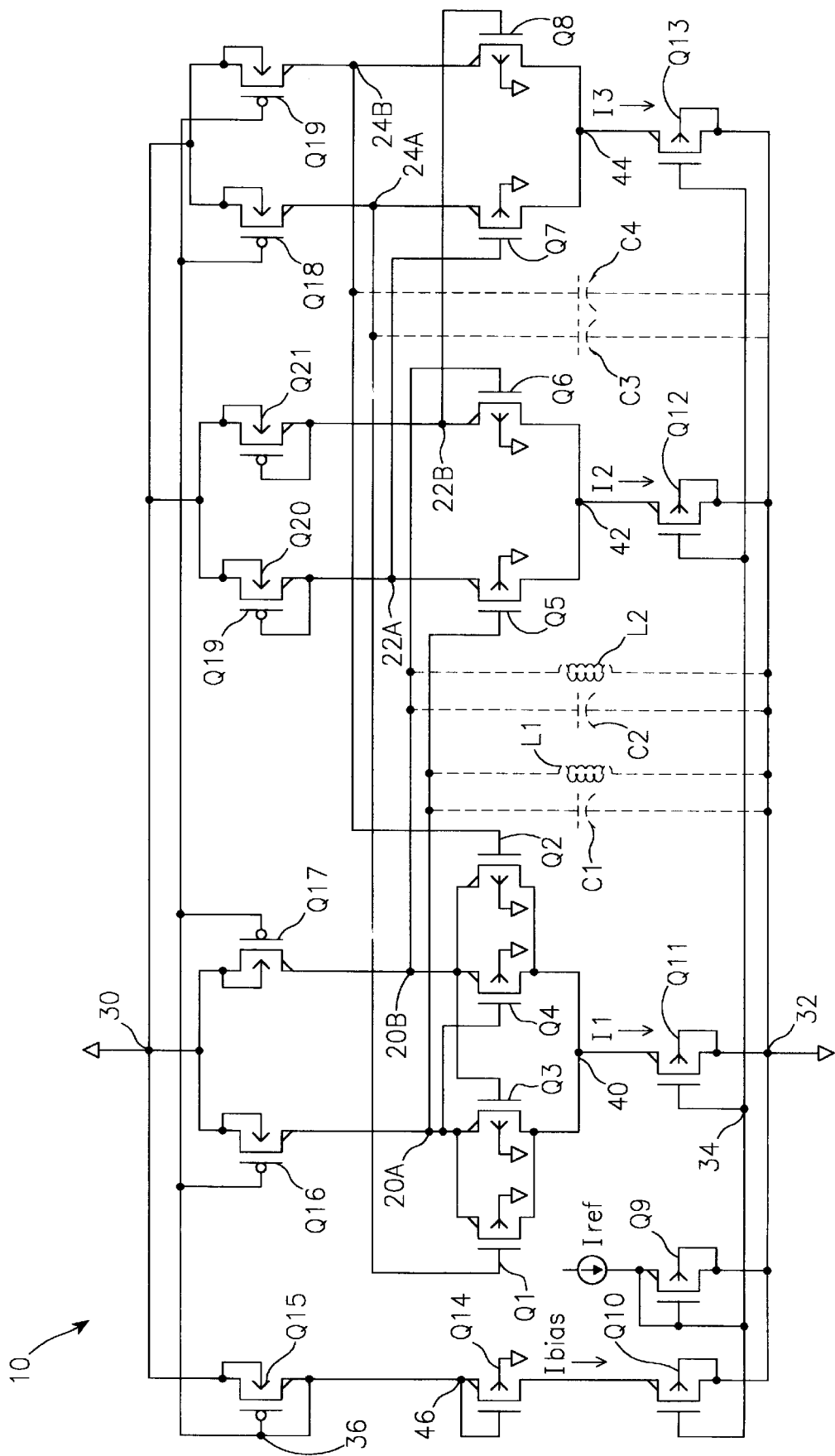
FIG. 2 illustrates a circuit diagram for the oscillator of FIG. 1.

FIG. 2 illustrates a circuit diagram for oscillator 10. Tank circuit 12 includes transistors Q1, Q2, Q3 and Q4, capacitors C1 and C2, inductors L1 and L2, and nodes 20A and 20B. Capacitors C1 and C2 are shown in phantom since they are not discrete devices, but rather, parasitic capacitances coupled to nodes 20A and 20B, respectively. Likewise, inductors L1 and L2 are shown in phantom since oscillator 10 is devoid of passive inductors. Inductors L1 and L2 represent the active inductance provided by transistors Q1 and Q2 for nodes 20A and 20B, respectively. Capacitor C1 and inductor L1 provide a parallel resonant circuit for node 20A, and capacitor C2 and inductor L2 provide a parallel resonant circuit for node 20B. The parallel resonant circuits have a matched resonant frequency that determines the oscillation frequency at nodes 20A and 20B. Buffer 14 includes transistors Q5 and Q6 and nodes 22A and 22B, and integrating circuit 16 includes transistors Q7 and Q8, capacitors C3 and C4, and nodes 24A and 24B. Capacitors C3 and C4 are shown in phantom since they are not discrete devices, but rather, parasitic capacitances coupled to nodes 24A and 24B, respectively.

Transistors Q1 and Q2 are a differential pair that provide active inductance at nodes 20A and 20B, respectively, in response to the third differential signal. Transistors Q3 and Q4 are a differential pair that provide negative resistance at nodes 20A and 20B, respectively, in response to the first differential signal, in order to amplify the first differential signal. Transistors Q5 and Q6 are a differential pair that generate the second differential signal in response to the first differential signal. Transistors Q7 and Q8 are a differential pair that, in conjunction with capacitors C3 and C4, generate the third differential signal, in response to the second differential signal, as an integral of the second differential signal.

The remaining transistors in oscillator 10 provide current control. Power supply terminal 30 is held at supply voltage VDD, and power supply terminal 32 is grounded. Diode-connected reference transistor Q9 receives reference current Iref from an external source and couples the reference current to ground. The gate of transistor Q9 establishes a bias voltage at node 34 which is applied to the gates of transistors Q10, Q11, Q12 and Q13. As a result, transistors Q10, Q11, Q12 and Q13 act as current mirrors for transistor Q9. Since transistors Q9, Q10, Q11, Q12 and Q13 are matched in size, currents Ibias, I1, I2 and I3, which flow through transistors Q10, Q11, Q12 and Q13, respectively, are essentially identical to, controlled by, and move in unison with the reference current.

The bias current flows through a bias circuit that includes transistor Q10 and diode-connected transistors Q14 and Q15. The gate of transistor Q15 establishes a bias voltage at node 36 which is applied to the gates of transistors Q16, Q17, Q18 and Q19. As a result, transistors Q16, Q17, Q18 and Q19 act as current mirrors for transistor Q15. Since transistor Q15 has a channel width that is essentially identical to the combined channel widths of transistors Q16 and Q17, and to the combined channel widths of transistors Q18 and Q19, and transistors Q15, Q16, Q17, Q18 and Q19 are otherwise matched in size, the currents that flow through transistors Q16, Q17, and Q18 and Q19 are essentially one-half the bias current. Accordingly, current I1 is evenly split between transistors Q16 and Q17, and current I3 is evenly split between transistors Q18 and Q19. Diode-connected load transistors Q20 and Q21 are matched in size, and therefore current I2 is evenly split between transistors Q20 and Q21.

Transistor Q14 has a channel width that is essentially identical to the combined channel widths of transistors Q1, Q2, Q3 and Q4, to the combined channel widths of transistors Q5 and Q6, and to the combined channel widths of transistors Q7 and Q8, and transistors Q14, Q1, Q2, Q3, Q4, Q5, Q6, Q7 and Q8 are otherwise matched in size. The gate of transistor Q14 is coupled to node 46, which is held at a constant voltage that is relatively close to the midpoint of the oscillating voltages at nodes 20A, 20B, 22A, 22B, 24A and 24B. Accordingly, transistor Q14, the combination of transistors Q1, Q2, Q3 and Q4, the combination of transistors Q5 and Q6, and the combination of transistors Q7 and Q8 provide similar DC loads for currents Ibias, I1, I2 and I3, respectively. In addition, the channel widths of transistors Q1 and Q2 are essentially identical, and the channel widths of transistors Q3 and Q4 are essentially identical, to facilitate evenly splitting current I1 through nodes 20A and 20B.

Minor variations occur between currents Iref, Ibias, I1, I2 and I3, and minor variations occur in splitting current I1 through nodes 20A and 20B, splitting current I2 through nodes 22A and 22B, and splitting current I3 through nodes 24A and 24B, due to variations in the channel length modulation of various transistors that arise from the first, second and third differential signals.

The transistors in oscillator 10 are driven into saturation. Therefore, current mirroring transistors Q11, Q12, Q13, Q16, Q17, Q18 and Q19 exhibit high output resistance (e.g., 1 megohm) at nodes 40, 42, 44, 20A, 20B, 24A and 24B, respectively. However, since the gates of transistors Q20 and Q21 are coupled to nodes 22A and 22B, respectively, transistors Q20 and Q21 exhibit low output resistance (e.g., 1 kilohm) at these nodes.

The current-voltage characteristics of an inductor are given by the expressions:

$$V = L \frac{dI}{dt} \quad (1)$$

$$I = \frac{1}{L} \int V dt \quad (2)$$

Thus, the inductor current represents the reciprocal of the inductance times the integral of the inductor voltage. Since the second differential signal is in phase with the first differential signal, and the third differential signal represents the integral of the second differential signal, the third differential signal represents the integral of the first differential signal. Transistors Q1 and Q2 provide drain currents that are proportional to their gate voltages. Since transistors Q1 and Q2 receive the third differential signal at their gates and have their drains coupled to nodes 20A and 20B, respectively, they provide current variations at nodes 20A and 20B, respectively, that correspond to the integral of the voltages at these nodes. In other words, transistors Q1 and Q2 act like inductors.

For instance, when the voltage at node 20A increases, the voltage at node 22A decreases, the voltage at node 24A increases with a 90 degree lag behind the voltage at node 20A, and the current through transistor Q1 between nodes 20A and 40 increases with a 90 degree lag behind the voltage at node 20A.

The current-voltage characteristics of a resistor are given by the expression:

$$R = \frac{V}{I} \quad (3)$$

Thus, the resistor voltage is in phase with and directly proportional to the resistor current. The first differential signal includes voltages at nodes 20A and 20B that are 180 degrees out of phase with one another. Transistors Q3 and Q4 provide drain currents that are proportional to their gate voltages. Transistors Q3 and Q4 receive the first differential signal at their gates and have their drains crosscoupled to nodes 20A and 20B. That is, transistor Q3 has its gate coupled to node 20B and its drain coupled to node 20A, and transistor Q4 has its gate coupled to node 20A and its drain coupled to node 20B. In this fashion, transistors Q3 and Q4 provide current variations at nodes 20A and 20B, respectively, that are in phase with and inversely proportional to the voltages at these nodes. In other words, transistors Q1 and Q2 provide negative resistance.

For instance, when the voltage at node 20A increases, the voltage at node 20B decreases, and the current through transistor Q3 between nodes 20A and node 40 decreases, thereby increasing the voltage increase at node 20A.

However, when the voltage swing at nodes 20A and 20B becomes large enough, the positive resistances coupled to nodes 20A and 20B become larger than the negative resistances provided by transistors Q3 and Q4, respectively, due non-linearities in oscillator 10. This limits the maximum voltage swing at nodes 20A and 20B.

Increasing the reference current increases the small signal transconductance of transistors Q1 and Q2, thereby increasing the differential mode current through transistors Q1 andand Q2. Increasing the reference current also increases the small signal transconductance of transistors Q7 and Q8, thereby increasing the voltage swing of the third differential signal which further increases the differential mode current through transistors Q1 andand Q2. As seen in expression (2), the inductor current is inversely proportional to the inductance. Therefore, increasing the reference current decreases the active inductance provided by transistors Q1 andand Q2.

The resonant frequency of a parallel resonant circuit is given by the expression:

$$f = \frac{1}{2\pi \sqrt{LC}} \quad (4)$$

Thus, as the inductance decreases, the resonant frequency increases. Accordingly, increasing the reference current decreases the inductance and increases the oscillating frequency, and decreasing reference current increases the inductance and decreases the resonant frequency.

The relationship between the reference current and the voltage swing of the third differential signal can be explained in terms of bandwidth. The bandwidth of a differential pair is inversely proportional to the RC product at the output nodes. Transistors Q18 and Q19 have high output impedance, and transistors Q20 and Q21 have low output impedance. Also, far more parasitic capacitance is coupled to nodes 24A and 24B than to nodes 22A and 22B. As a result, transistors Q5 and Q6 have low gain and high bandwidth, and transistors Q7 and Q8 have high gain and low bandwidth. In fact, the frequency pole for transistors Q5 and Q6 remains above the oscillation frequency, and the frequency pole for transistors Q7 and Q8 remains below the oscillation frequency. Therefore, as the oscillation frequency changes, the gain of transistors Q5 and Q6 is relatively flat, whereas the gain of transistors Q7 and Q8 drops about 20 db per decade. Accordingly, the reference current controls the voltage swing of the third differential signal.

It should also be noted that the drain-to-source parasitic resistance of the transistors coupled to nodes 20A, 20B, 22A, 22B, 24A and 24B tends to decrease as their drain current increases. Thus, the bandwidths at these nodes tend to increase as currents I1, I2 and I3 increase. Therefore, increasing the reference current not only increases the oscillation frequency, but also increases the bandwidths at these nodes. This bandwidth tracking by tank circuit 12, buffer 14 and integrating circuit 16 increases the frequency range over which oscillator 10 can operate.

Oscillator 10 has high immunity to common-mode noise. As the common-mode voltage at nodes 20A and 20B increases, the common-mode voltage at nodes 22A and 22B decreases, the common-mode voltage at nodes 24A and 24B increases, and the negative feedback decreases the common-mode voltage at nodes 20A and 20B. Likewise, as the common-mode voltage at nodes 20A and 20B decreases, the common-mode voltage at nodes 22A and 22B increases, the common-mode voltage at nodes 24A and 24B decreases, and the negative feedback increases the common-mode voltage at nodes 20A and 20B. Accordingly, the common-mode loop provides negative commonmode feedback, thereby preventing lock-up. If transistors Q5 and Q6 were removed and nodes 20A and 20B were coupled to the gates of transistors Q7 and Q8, respectively, then the common-mode loop would have positive common-mode feedback and would be highly susceptible to lock-up.

Figure 3:
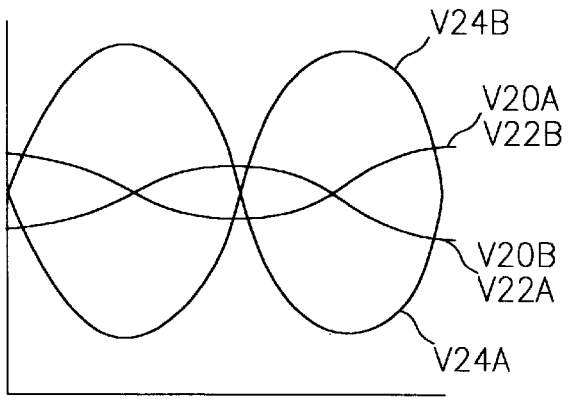
FIG. 3 illustrates the differential signals for the circuit of FIG. 2.

FIG. 3 illustrates the differential signals associated with oscillator 10. The first differential signal includes oscillating voltages (V20A and V20B) at nodes 20A and 20B, respectively, that are equal in magnitude and phase shifted from one another by 180 degrees. The second differential signal includes oscillating voltages (V22A and V22B) at nodes 22A and 22B, respectively, that are equal in magnitude and phase shifted by one another by 180 degrees. The third differential signal includes oscillating voltages (V24A and V24B) at nodes 24A and 24B, respectively, that are equal in amplitude and phase shifted from one another by 180 degrees. The voltages at nodes 20A and 22B have equal amplitudes and are in phase with one another, and are shown as a single waveform. Likewise, voltages at nodes 20B and 22A have equal amplitudes and are in phase with one another, and are shown as a single waveform. The voltages at nodes 24A and 24B have larger amplitudes than the voltages at nodes 20A and 20B, respectively, and lag the voltages at nodes 20A and 20B, respectively, by 90 degrees.

Figure 4:
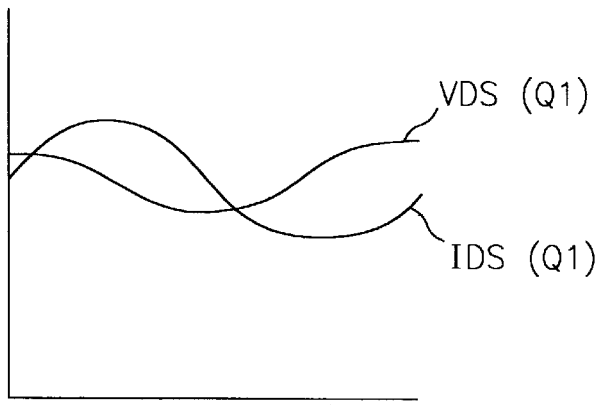
FIG. 4 illustrates current-voltage characteristics for an active inductor in the circuit of FIG. 2.

FIG. 4 illustrates the drain-to-source voltage (VDS) and drain-to-source current (IDS) for transistor Q1. As is seen, VDS leads IDS by 90 degrees. As a result, transistor Q1 andprovides an active inductor between nodes 20A and 40.

Figure 5:
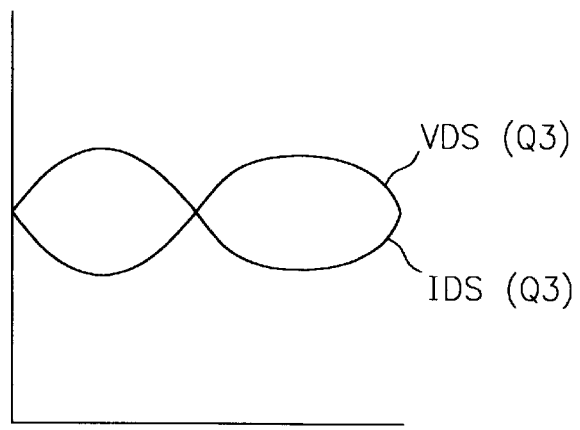
FIG. 5 illustrates current-voltage characteristics for a negative resistance element in the circuit of FIG. 2.

FIG. 5 illustrates the drain-to-source voltage (VDS) and drain-to-source current (IDS) for transistor Q3. As is seen, VDS and IDS are phase shifted from one another by 180 degrees. As a result, transistor Q3 provides negative resistance between nodes 20A and 40.

Figure 6:
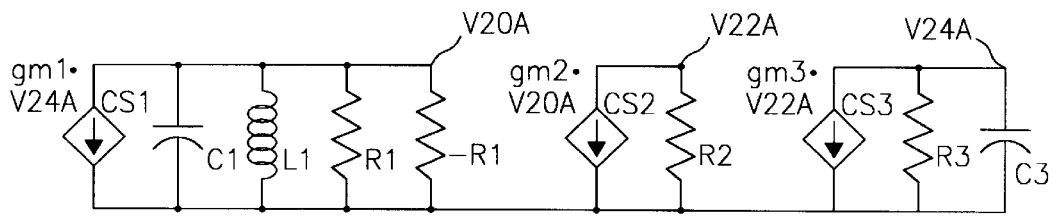
FIG. 6 illustrates single-ended small signal model for the circuit of FIG. 2.

FIG. 6 illustrates a single-ended small signal model for oscillator 10. The three stages represent nodes 20A, 20B and 20C, respectively. Current source CS1 supplies a current corresponding to the product of transconductance gm1 and the voltage at node 24A, current source CS2 supplies a current corresponding to the product of transconductance gm2 and the voltage at node 20A, and current source CS3 supplies a current corresponding to the product of transconductance gm3 and the voltage at node 22A. Resistor R1 represents the positive resistance at node 20A, resistor R2 represents the positive resistance at node 22A, and resistor R3 represents the positive resistance at node 24A. Resistors R1, R2 and R3 arise from channel length modulation of the transistors coupled to the respective nodes. Resistor-R1 represents the negative resistance of transistor Q3 at node 20A. Capacitor C1 and inductor L1 provide the parallel resonant circuit at node 20A, and capacitor C3 provides the voltage integration at node 24A.

Capacitors C1, C2, C3 and C4 are provided by parasitic capacitances and do not require discrete capacitors such as MOS transistors. Capacitor C1 includes the lumped parasitic capacitances of the drains of transistors Q1, Q3 and Q16, the gates of transistors Q4 and Q5, and the wires coupled to node 20A. Capacitor C2 includes the lumped parasitic capacitances of the drains of transistors Q2, Q4 and Q17, the gates of transistors Q3 and Q6, and the wires coupled to node 20B. Capacitor C3 includes the lumped parasitic capacitances of the drains of transistors Q7 and Q18, the gate of transistor Q1, and the wires coupled to node 24A. Capacitor C4 includes the lumped parasitic capacitance of the drains of transistors Q8 and Q19, the gate of transistor Q2, and the wires coupled to node 24B. The wires between nodes 24A and 24B and the gates of transistors Q1 and Q2, respectively, are relatively long from a layout perspective, which adds additional capacitance. Furthermore, these wires can be designed for increased capacitance.

Figure 7:
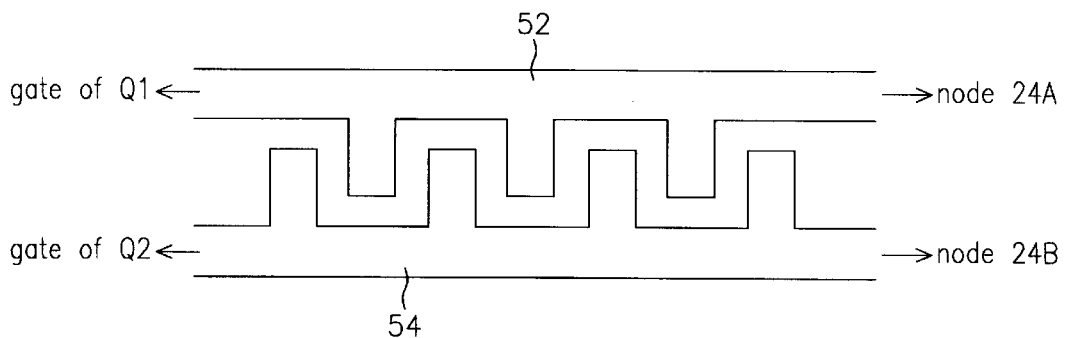
FIG. 7 and 8 illustrate techniques for increasing wire capacitance in the circuit of FIG. 2.

FIG. 7 illustrates providing additional wire capacitance by interdigitizing portions of coplanar wires. Wire 52 extends between the gate of transistor Q1 and node 24A, and wire 54 extends between the gate of transistor Q2 and node 24B. As seen from a top plan view, wires 52 and 54 include interdigitized portions that increase their capacitive. The interdigitized portions can provide the majority of parasitic capacitance for capacitors C3 and C4.

Figure 8:
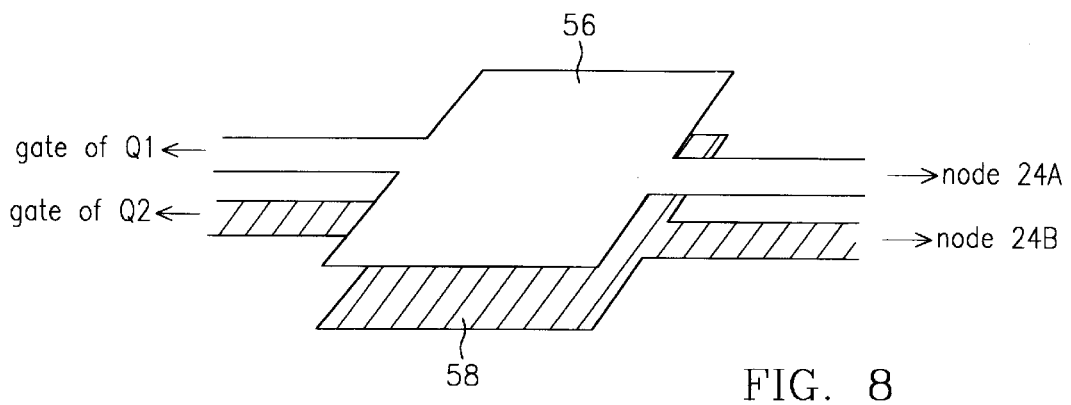

FIG. 8 illustrates providing additional wire capacitance by enlarging portions of stacked wires. Wire 56 extends between the gate of transistor Q1 andand node 24A, and wire 58 extends between the gate of transistor Q2 and node 24B. As seen from a perspective view, wires 56 and 58 include enlarged portions that increase their capacitance. The enlarged portions can provide the majority of parasitic capacitance for capacitors C3 and C4.

Applicant has simulated the operation of oscillator 10. In a computer simulation, the transistors had 0.6 micron channel lengths and VDD was set to 3.3 volts. Transistors Q1–Q2 had 8 micron channel widths, transistors Q3–Q4 had 4 micron channel widths, transistors Q5–Q13 and Q16–Q21 had 12 micron channel widths, and transistors Q14–Q15 had 24 micron channel widths. Capacitors C1–C2 were I femtofarad, and capacitors C3 and C4 were provided by a 10 femtofarad capacitor between nodes 24A and 24B. A 1 volt pulse was applied to node 20A to initiate oscillation, although noise would initiate oscillation in the actual circuit. The first and third differential signals had a voltage swing of about 1 to 2 volts, and the second differential signal had a voltage swing of about 0.5 to 1.5 volts. The oscillation frequency as a function of reference current is listed below in Table 1.

TABLE 1

| Reference Current | Oscillation Frequency |
| --- | --- |
| 2 microamps | 18.5 megahertz |
| 20 microamps | 83 megahertz |
| 200 microamps | 370 megahertz |
| 2 milliamps | 1 gigahertz |

Figure 9:
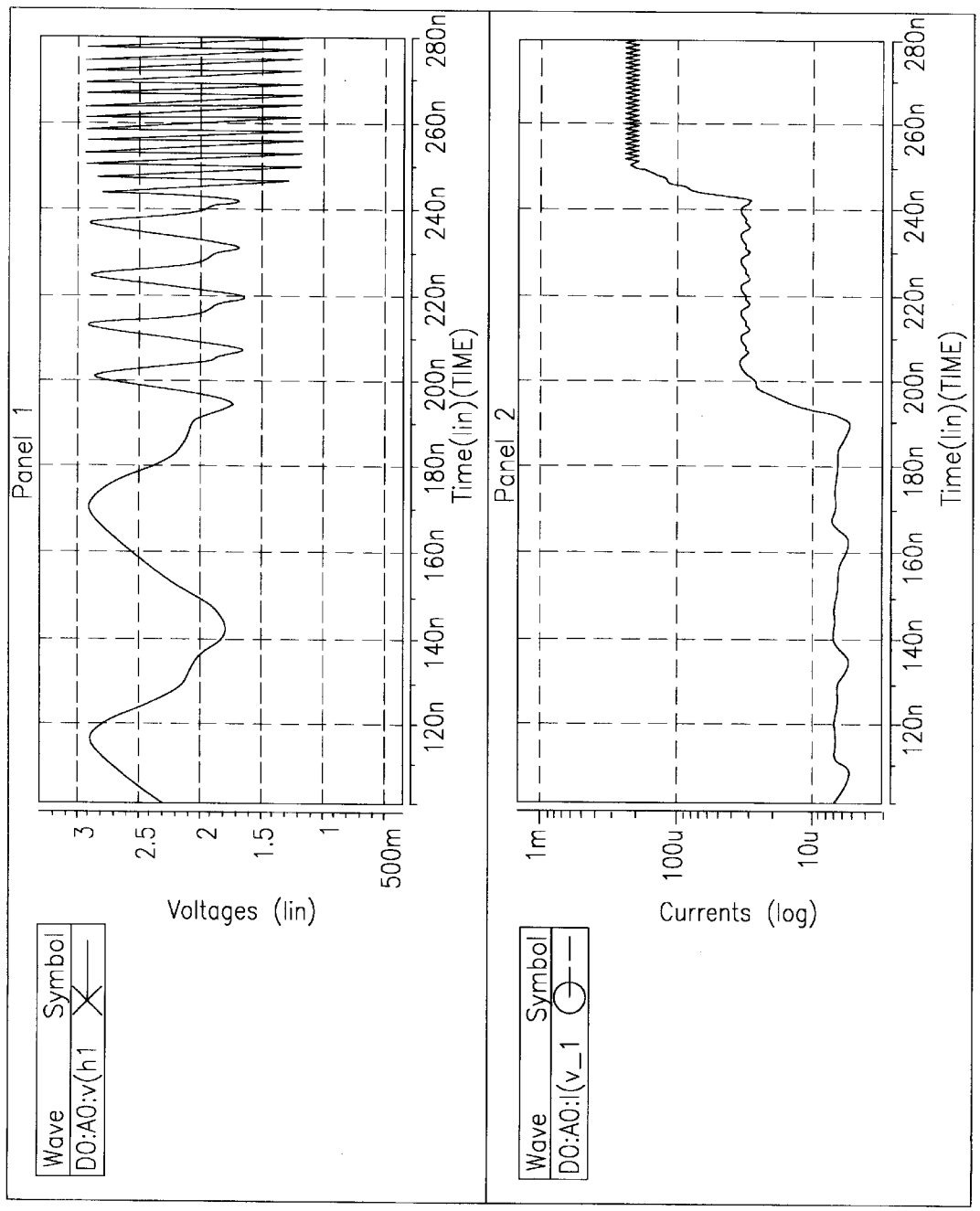
FIG. 9 illustrates computer simulated waveforms for the circuit of FIG. 2.

This constitutes a 54× frequency range. FIG. 9 illustrates computer simulated waveforms at the first three frequencies, with the voltage (V20A) measured at node 20A and the current (I1) measured between nodes 40 and 32.

Figure 10:
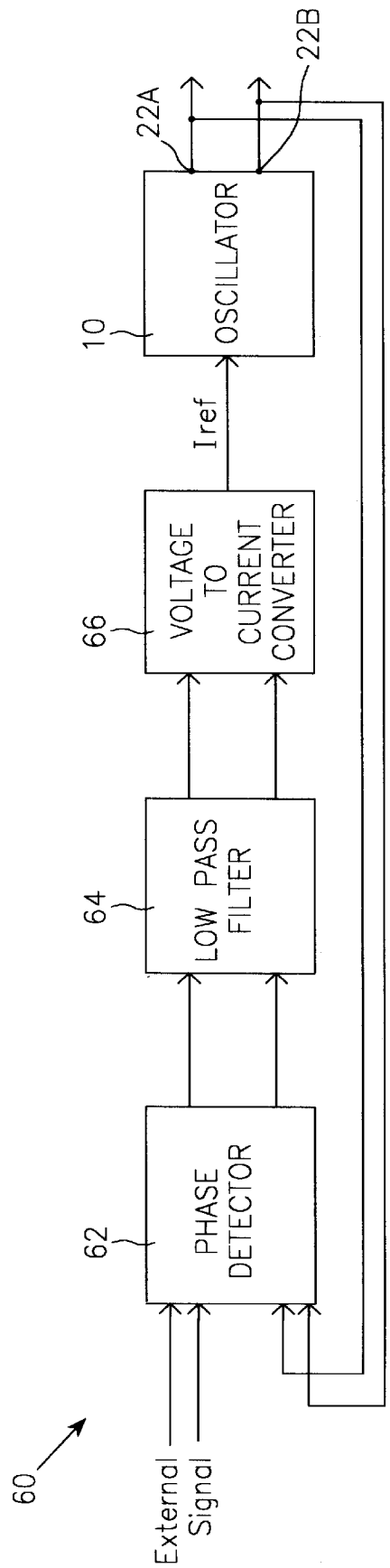
FIG. 10 illustrates the oscillator of FIG. 1 in a phase-locked loop.

FIG. 10 shows oscillator 10 in a phase-locked loop. Phase-locked loop 60 includes phase detector 62, low pass filter 64, voltage-to-current converter 66, and oscillator 10. An external differential signal and the second differential signal from oscillator 10 are applied to phase detector 62, the output of which is coupled to low pass filter 64 which provides a signal to voltage-to-current converter 66. Voltage-to-current converter 66 provides the reference current for oscillator 10. The output of oscillator 10 is taken from nodes 22A and 22B, although it could be taken from nodes 20A and 20B or from nodes 24A and 24B.

Oscillator 10 is well-suited for various clock recovery circuits as well as other circuits that employ current-controlled oscillators. Preferably, oscillator 10 is embodied in an integrated circuit chip in a computer system.

Other variations and modifications of the embodiments disclosed herein may be made based on the description set forth herein without departing from the scope and spirit of the invention as set forth in the following claims.

What is claimed is:

1. An active inductor oscillator, comprising:
    a tank circuit for generating a first differential signal;
    a common-mode inverting differential buffer for generating a second differential signal in response to the first differential signal; and
    an integrating circuit for generating a third differential signal in response to the second differential signal, wherein the third differential signal is applied to the tank circuit.

2. The oscillator of claim 1, wherein:
    the tank circuit generates the first differential signal at first and second nodes;
    the buffer generates the second differential signal at third and fourth nodes and in phase with the first differential signal; and
    the integrating circuit generates the third differential signal at fifth and sixth nodes and phase shifted to lag the first and second differential signals.

3. The oscillator of claim 2, wherein:
    the tank circuit includes a first differential transistor pair responsive the third differential signal and a cross-coupled transistor pair responsive to the first differential signal;
    the buffer includes a second differential transistor pair responsive to the first differential signal; and
    the integrating circuit includes a third differential transistor pair responsive to the second differential signal.

4. The oscillator of claim 3, wherein the cross-coupled transistor pair provide negative resistance at the first and second nodes that amplifies the first differential signal.

5. The oscillator of claim 3, wherein the first differential transistor pair provide active inductance at the first and second nodes.

6. The oscillator of claim 1, wherein essentially identical currents that are decoupled from one another flow through the tank circuit, the buffer, and the integrating circuit, and are controlled by and move in unison with an externally applied reference current that controls an oscillation frequency of the oscillator.

7. The oscillator of claim 6, wherein the oscillator includes:

first and second power supply terminals a biasing circuit between the first and second power terminals that receives the control current;

first and second current mirrors coupled to the biasing circuit and between the first power supply terminal and the tank circuit;

third and fourth current mirrors coupled to the biasing circuit and between the first power supply terminal and the integrating circuit;

first and second diode loads between the first power supply terminal and the buffer; and fifth, sixth and seventh current mirrors coupled to the biasing circuit and between the second power supply terminal and the tank circuit, the buffer and the integrating circuit, respectively.

8. The oscillator of claim 1, wherein the tank circuit, the buffer and the integrating circuit form a common-mode loop, the buffer provides 180 degrees of phase shift for the common-mode loop, and integrating circuit provides negative common-mode feedback to the tank circuit.

9. The oscillator of claim 1, wherein the oscillator has an oscillation frequency range, representing a ratio of a first frequency to a second frequency, of at least 50.

10. The oscillator of claim 1, embodied in an integrated circuit chip.

11. An active inductor oscillator, comprising:

a tank circuit that includes first and second transistors coupled to first and second nodes, respectively, first and second capacitors coupled to the first and second nodes, respectively, a negative resistance circuit coupled to the first and second nodes, wherein the tank circuit generates a first differential signal at the first and second nodes;

a common-mode inverting differential buffer that includes third and fourth transistors coupled to the first and second nodes, respectively, and coupled to third and fourth nodes, respectively, wherein the buffer generates a second differential signal at the third and fourth nodes that is in phase with the first differential signal; and an integrating circuit that includes fifth and sixth transistors coupled to the third and fourth nodes, respectively, and coupled to fifth and sixth nodes, respectively, and third and fourth capacitors coupled to the fifth and sixth nodes, respectively, wherein the integrating circuit generates a third differential signal at the fifth and sixth nodes that is phase shifted to lag the first and second differential signals;

wherein the first and second transistors and coupled to the fifth and sixth nodes, respectively, and provide active inductors for the tank circuit.

12. The oscillator of claim 11, wherein:

the first transistor includes a control terminal coupled to the fifth node, an output terminal coupled to the first node, and another output terminal coupled to a seventh node;

the second transistor includes a control terminal coupled to the sixth node, an output terminal coupled to the second node, and another output terminal coupled to the seventh node;

the third transistor includes a control terminal coupled to the first node, an output terminal coupled to the third node, and another output terminal coupled to an eighth node;

the fourth transistor includes a control terminal coupled to the second node, an output terminal coupled to the fourth node, and another output terminal coupled to the eighth node;

the fifth transistor includes a control terminal coupled to the third node, an output terminal coupled to the fifth node, and another output terminal coupled to a ninth node; and the sixth transistor includes a control terminal coupled to the fourth node, an output terminal coupled to the sixth node, and another output terminal coupled to the ninth node.

13. The oscillator of claim 12, wherein:

the negative resistance circuit includes seventh and eighth transistors;

the seventh transistor includes a control terminal coupled to the second node, an output terminal coupled to the first node, and another output terminal coupled to the seventh node; and the eighth transistor includes a control terminal coupled to the first node, an output terminal coupled to the second node, and another output terminal coupled to the seventh node.

14. The oscillator of claim 13, wherein the oscillator includes:

first and second power supply terminals a biasing circuit between the first and second power supply terminals;

first and second current mirrors coupled to the biasing circuit and between the first power supply terminal and the first and second nodes, respectively;

third and fourth current mirrors coupled to the biasing circuit and between first power supply terminal and the fifth and sixth nodes, respectively;

first and second diodes between the first power supply terminal and the third and fourth nodes, respectively; and fifth, sixth and seventh current mirrors coupled to the biasing circuit and between the second power supply terminal and the seventh, eighth and ninth nodes, respectively.

15. The oscillator of claim 14, wherein essentially identical currents that are decoupled from one another flow through the tank circuit, the buffer, and the integrating circuit, and are controlled by and move in unison with an externally applied reference current that controls an oscillation frequency of the oscillator.

16. The oscillator of claim 15, wherein:

the biasing circuit includes a ninth transistor with a control terminal coupled to a tenth node, an output terminal coupled to the first power supply terminal, and another output terminal coupled to further circuitry in the biasing circuit;

the biasing circuit includes a tenth transistor with a control terminal coupled to an eleventh node, an output terminal coupled to the second power supply terminal, and another output terminal coupled to the further circuitry in the biasing circuit;

an eleventh transistor includes a control terminal and an output terminal coupled to the eleventh node and the reference current, and another output terminal coupled to the second power supply terminal;

the first current mirror includes a twelfth transistor with a control terminal coupled to the tenth node, an output terminal coupled to the first power supply terminal, and another output terminal coupled to the first node;

the second current mirror includes an thirteenth transistor with a control terminal coupled to the tenth node, an output terminal coupled to the first power supply terminal, and another output terminal coupled to the second node;

the third current mirror includes a fourteenth transistor with a control terminal coupled to the tenth node, an output terminal coupled to the first power supply terminal, and another output terminal coupled to the fifth node;

the fourth current mirror includes a fifteenth transistor with a control terminal coupled to the tenth node, an output terminal coupled to the first power supply terminal, and another output terminal coupled to the sixth node;

the first diode includes a sixteenth transistor with a control terminal and an output terminal coupled to the third node, and another output terminal coupled to the first power supply terminal;

the second diode includes a seventeenth transistor with a control terminal and an output terminal coupled to the fourth node, and another output terminal coupled to the first power supply terminal;

the fifth current mirror includes an eighteenth transistor with a control terminal coupled to the eleventh node, an output terminal coupled to the second power supply terminal, and another output terminal coupled to the seventh node;

the sixth current mirror includes a nineteenth transistor with a control terminal coupled to the eleventh node, an output terminal coupled to the second power supply terminal, and another output terminal coupled to the eighth node; and the seventh current mirror includes twentieth transistor with a control terminal coupled to the eleventh node, an output terminal coupled to the second power supply terminal, and another output terminal coupled to the ninth node.

17. The oscillator of claim 13, wherein:
the first, second, third, fourth, fifth, sixth, seventh, and eighth transistors are N-channel FETs with essentially identical channel lengths; and
the first and second transistors have a first channel width, the third and fourth transistors have a second channel width, and the fifth, sixth, seventh and eighth transistors have a third channel width essentially identical to a sum of the first and second channel widths.

18. The oscillator of claim 11, wherein the first, second, third and fourth capacitors consist of parasitic capacitances.

19. The oscillator of claim 11, further including a phase-locked loop that includes:
a phase detector;
a loop filter coupled to the phase detector;
a voltage-to-current converter coupled to the loop filter; and
the oscillator coupled to the voltage-to-current converter and the phase detector.

20. The oscillator of claim 11, embodied in a computer system.

21. A method of operating an active inductor oscillator, comprising the steps of:
applying a first differential signal generated by a tank circuit to a common-mode inverting differential buffer;
applying a second differential signal generated by the buffer to an integrating circuit; and
applying a third differential signal generated by the integrating circuit to the tank circuit.

22. The method of claim 21, including:
generating the second differential signal in phase with the first differential signal; and
generating the third differential signal to lag the first and second differential signals by a phase of about 90 degrees.

23. The method of claim 21, including generating first, second and third currents through the tank circuit, the buffer and the integrating circuit, respectively, wherein the first, second and third currents are decoupled from one another and are controlled by and move in unison with a reference current that controls an oscillation frequency of the oscillator.

24. The method of claim 21, including:
operating a negative resistance circuit, in response to the first differential signal, to provide negative resistances that offset positive resistances of a differential transistor pair and that amplify the first differential signal; and
operating the differential transistor pair, in response to the third differential signal, to provide active inductors in the tank circuit.

25. The method of claim 21, including operating a cross-coupled transistor pair with drains coupled to the first differential signal and with gates coupled to the third differential signal to provide active inductors in the tank circuit.

26. The method of claim 21, including operating the buffer to provide 180 degrees of common-mode phase shift so that the integrating circuit provides negative common-mode feedback to the tank circuit.

27. The method of claim 21, including operating the integrating circuit with a substantially higher gain than that of the buffer.

28. The method of claim 21, including operating the integrating circuit with a substantially lower bandwidth than that of the buffer.

29. The method of claim 21, including operating the oscillator in response to a reference current in a phase-locked loop.

30. The method of claim 21, including operating the oscillator to generate an oscillating signal in a computer system.

31. A method of providing an active inductor oscillator, comprising the steps of:
providing a tank circuit for generating a first differential signal;
providing a common-mode inverting differential buffer for receiving the first differential signal and for generating a second differential signal; and
providing an intergrating circuit for receiving the second differential signal and for generating a third differential signal that is applied to the tank circuit.

32. The method of claim 31, wherein:

the tank circuit includes first and second transistors coupled to first and second nodes, respectively, first and second capacitors coupled to the first and second nodes, respectively, a negative resistance circuit coupled to the first and second nodes, and the tank circuit generates the first differential signal at the first and second nodes;

the buffer includes third and fourth transistors coupled to the first and second nodes, respectively, and coupled to third and fourth nodes, respectively, and the buffer generates the second differential signal at the third and fourth nodes and in phase with the first differential signal; and the integrating circuit includes fifth and sixth transistors coupled to the third and fourth nodes, respectively, and coupled to fifth and sixth nodes, respectively, and third and fourth capacitors coupled to the fifth and sixth nodes, respectively, wherein the integrating circuit generates the third differential signal at the fifth and sixth nodes and phase lagging the first and second differential signals, and the first and second transistors are coupled to the fifth and sixth nodes, respectively.

33. The method of claim 32, wherein:

the first transistor includes a control terminal coupled to the fifth node, an output terminal coupled to the first node, and another output terminal coupled to a seventh node;

the second transistor includes a control terminal coupled to the sixth node, an output terminal coupled to the second node, and another output terminal coupled to the seventh node;

the third transistor includes a control terminal coupled to the first node, an output terminal coupled to the third node, and another output terminal coupled to an eighth node;

the fourth transistor includes a control terminal coupled to the second node, an output terminal coupled to the fourth node, and another output terminal coupled to the eighth node;

the fifth transistor includes a control terminal coupled to the third node, an output terminal coupled to the fifth node, and another output terminal coupled to a ninth node; and the sixth transistor includes a control terminal coupled to the fourth node, an output terminal coupled to the sixth node, and another output terminal coupled to the ninth node.

34. The method of claim 33, wherein:

the first and second transistors provide active inductance at the first and second nodes, respectively, thereby providing inductance for first and second parallel resonant circuits coupled to the first and second nodes, respectively, in response to the third differential signal; and the negative resistance circuit includes cross-coupled seventh and eighth transistors, both coupled to the first and second nodes, for amplifying the first differential signal in response to the first differential signal.

35. The method of claim 34, wherein the oscillator is embodied in an integrated circuit chip.

36. An oscillator, comprising:

a tank circuit for generating a first differential signal, wherein the tank circuit includes a parallel resonant LC circuit and essentially all inductance for the parallel LC circuit is provided by active inductance;

a common-mode inverting differential buffer for generating a second differential signal in response to the first differential signal; and an integrating circuit for generating a third differential signal in response to the second differential signal, wherein the third differential signal represents an integral of the second differential signal and is applied to the tank circuit.

37. The oscillator of claim 36, wherein the first and second differential signals are essentially in phase, and the third differential signal lags the first and second differential signals by about 90 degrees.

38. The oscillator of claim 36, wherein the buffer is a high bandwidth, low gain stage, and the integrating circuit is a low bandwidth, high gain stage.

39. The oscillator of claim 36, wherein the buffer includes a first differential transistor pair responsive to the first differential signal with frequency pole above an oscillation frequency of the oscillator, and the integrating circuit includes a second differential transistor pair responsive to the second differential signal with a frequency pole below the oscillation frequency.

40. The oscillator of claim 39, wherein the first differential transistor pair is directly connected to the second differential transistor pair.

41. The oscillator of claim 36, wherein essentially all capacitance for the parallel resonant LC circuit is provided by parasitic capacitance.

42. The oscillator of claim 36, wherein essentially all capacitance for the integrating circuit is provided by parasitic capacitance.

43. The oscillator of claim 42, wherein the parasitic capacitance is provided at least in part by first and second wires between the tank circuit and the integrating circuit which carry the third differential signal.

44. The oscillator of claim 43, wherein the first and second wires are coplanar and include interdigitized portions that provide a majority of the parasitic capacitance.

45. The oscillator of claim 43, wherein the first and second wires are stacked and include enlarged portions that provide a majority of the parasitic capacitance.

46. The oscillator of claim 36, wherein the first, second and third differential signals are sinusoidal signals.

47. The oscillator of claim 36, wherein an oscillation frequency of the oscillator is controlled by an externally applied reference current.

48. The oscillator of claim 36, wherein the buffer and the integrating circuit are each essentially devoid of a parallel resonant LC circuit.

49. The oscillator of claim 36, wherein the oscillator consists of MOS transistors.

50. The oscillator of claim 36, wherein the oscillator consists of the tank circuit, buffer and the integrating circuit.

* * * * *